(12) United States Patent
Hsu

(10) Patent No.: US 7,326,078 B1
(45) Date of Patent: Feb. 5, 2008

(54) SHIELD MEMBER

(75) Inventor: Yung-Chin Hsu, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/508,487

(22) Filed: Aug. 22, 2006

(51) Int. Cl.
*H01R 13/64* (2006.01)

(52) U.S. Cl. ..................... 439/377; 361/727

(58) Field of Classification Search ........... 439/377, 439/945, 946, 374; 361/727
See application file for complete search history.

(56) References Cited

U.S. PATENT DOCUMENTS

| | | | | |
|---|---|---|---|---|
| 5,262,923 A | * | 11/1993 | Batta et al. | 361/685 |
| 5,805,429 A | * | 9/1998 | Andersson | 361/799 |
| 5,806,949 A | * | 9/1998 | Johnson | 312/334.7 |
| 5,860,828 A | * | 1/1999 | Anderson et al. | 439/377 |
| 6,067,225 A | * | 5/2000 | Reznikov et al. | 361/685 |
| 6,249,432 B1 | * | 6/2001 | Gamble et al. | 361/685 |
| 6,407,913 B1 | * | 6/2002 | Peachey et al. | 361/685 |
| 6,442,020 B1 | * | 8/2002 | Liu et al. | 361/683 |
| 6,948,967 B2 | * | 9/2005 | Scherer et al. | 439/377 |

* cited by examiner

*Primary Examiner*—Tho D. Ta
(74) *Attorney, Agent, or Firm*—Peter F. Corless; Steven M. Jensen; Edwards Angell Palmer & Dodge LLP

(57) ABSTRACT

The present invention provides a shield member for covering the slot of an electronic device, including at least a body for inserting and pluggable into the slot; a slide block disposed on the surface of the body and corresponding to the slot; and an elastic portion disposed on the surface of the slide block and elastically contacting the wall of the slot for the body to be tightly inserted into the slot. The invention employs the elastic portion to allow a body having a minimum length required to be inserted tightly into the slot, thereby reducing the material cost.

8 Claims, 3 Drawing Sheets

SHIELD MEMBER

BACKGROUND OF THE INVENTION

1. Field of the Invention

The present invention relates to shielding members, and more particularly, to a shield member for covering a slot of an electronic device.

2. Description of Related Art

The primary function of an industrial server is to store massive data therein, and the hardware thereof is generally carried by carriers to be plugged into a plurality of slots of the server by way of hot swap.

Referring to FIG. 1, a server 1 having a plurality of slots 10 for receiving hard disk carriers 11 therein is illustrated, in which unused slots 10 are covered by a shield member 12 for shielding the slots from dust and electromagnetic interference. Users may choose among different manufacturers the appropriate servers having a sufficient number of slots that suit to their needs; on the other hand, spare slots are often reserved for emergency use and convenient replacement in the case of an electric breakdown of the slots in use.

As shown in the drawing, a slide block 120 is provided at an outer edge of the shield member 12 corresponding to the slot 10 to enable the shield member 12 to be slidably disposed in the slot 10; a plurality of stopping tabs 13 is disposed at the front of the slot 10 of the server 1, the shield member 12 also including connecting tabs 125 that abut against an outer wall of the stopping tabs 13 to position and meet the insertion depth of the shield member 12 in the slot 10. A handle 121 is axially provided as well as a set of block bodies 122 that are elastically disposed on the front of the shield member 12; block bodies 122 are disposed on one end of the handle 121 while a wedge 123 is disposed on the other end thereof that abuts against an inner wall of stopping tabs 13 by the assembly of the handle 121 and block bodies 122 and, works in conjunction with the connecting tab 125, is to be stopped by an outer edge of the stopping tabs 13 to thereby fix the shield member 12 in the slot 10.

However, in the foregoing structure, there exists a drawback of the insufficient coupling between the shield member 12 and the slot 10 by the slide block 120 in that the slide block does not have the flexibility required to be tightly abut against the wall of the slot 10, resulting in a common difference of coupling between the two. In order to more securely plug the shield member in the slot 10, it is required to increase the length of at least one side of the shield member 12 to allow more slide blocks 120 to be disposed thereon, which undesirably necessitates the use of more material to fabricate slide blocks 120. And, even if the length of the shield member 12 is increased and more slide blocks 120 are disposed thereon, there still exists a gap between the shield member 12 and the wall of the slot such that when exerting force on the shield member 12 for insertion, the shield member tends to get stuck due to uneven pressure exerted thereon and cannot be smoothly inserted in the groove.

Moreover, the length of the hard disk carrier 11 is made to comply with the depth of the slot 10 after pushing the hard disk carrier 11 toward the slot 10 to electrically connect the server 1 and secure the hard disk carrier 11 in the groove 10; however, because of the consideration of costs, the length of the shield member 12 is often designed and made shorter than the depth of the slot 10, as a consequence, the connecting tab 125 becomes an sole means for connecting the stopping protrusions 100 in order to position the shield member in the slot, yet such a approach often causes the connecting tab 125 to disengage from the stopping protrusion 13 because of the problem of getting stuck caused by uneven pressure as mentioned above.

Therefore, it is desirable to develop a novel mechanism capable of improving on the drawbacks of prior arts.

SUMMARY OF THE INVENTION

The present invention aims to eliminate the aforementioned drawbacks, and, as such, a primary objective of the present invention is to provide a shield member having a relatively shorter length and smaller size that helps to reduce the material cost.

Another objective of the present invention is to provide a shield member that can be fittingly inserted in the slot of an electronic device and prevented from getting stuck to facilitate smooth insertion.

Another objective of the present invention is to provide a shield member that can be securely positioned to meet the depth of the slot of an electronic device.

In order to achieve the above and other objectives, the present invention provides a shield member for covering the slot of an electronic device, including at least a body for inserting and pluggable into the slot; a slide block disposed on the surface of the body and corresponding to the slot; and an elastic portion disposed on the surface of the slide block and elastically contacting the wall of the slot for the body to be tightly inserted into the slot In contrast to prior techniques that necessitates increasing the length of the shield member so that more slide blocks can be disposed thereon, the shield member of the invention employs an elastic portion thereof that elastically contacts the wall of the slot so as to be smoothly and tightly inserted in the slot, thereby reducing the length thereof and the material cost as a result.

The elastic portion is tightly inserted into the slot along with the insertion of the body in the slot of the electronic device, which eliminates a problem of getting stuck caused by the swing insertion due to the uneven pressure exerted thereto.

The slot of the electronic device is provided with a first connecting tab and a second connecting tab is disposed on a side surface of the body that corresponds to an outer edge of the first connecting tab, thereby positioning to meet the insertion depth of the shield member in the slot, which ensures that the shield member does not get stuck in the slot by using its elastic portion to enable the second connecting tab thereof to connect and abut against the first connecting tab, thereby overcoming the drawback of disengagement from one another as occurred in the prior art.

Further, the shield member of the invention can include a plurality of third connecting tabs to connect and abut against an existing structure provided in the slot when the body is inserted into the slot, thereby enforcing the insertion and spreading the pressure exerted to the first connecting tab. The present invention offers advantages over the prior art techniques as it has been proved to easily pass the drop tests and have industrial applicability.

BRIEF DESCRIPTION OF DRAWINGS

The shield member of the present invention can be fully understood by reading the following detailed description of the preferred embodiment, with reference made to the accompanying drawings, wherein.

DETAILED DESCRIPTION OF PREFERRED EMBODIMENT

The present invention is described in the following so that one skilled in the pertinent art can easily understand other advantages and effects of the present invention. The present invention may also be implemented and applied according to other embodiments, and the details may be modified based on different views and applications without departing from the spirit of the invention.

Figure 1:
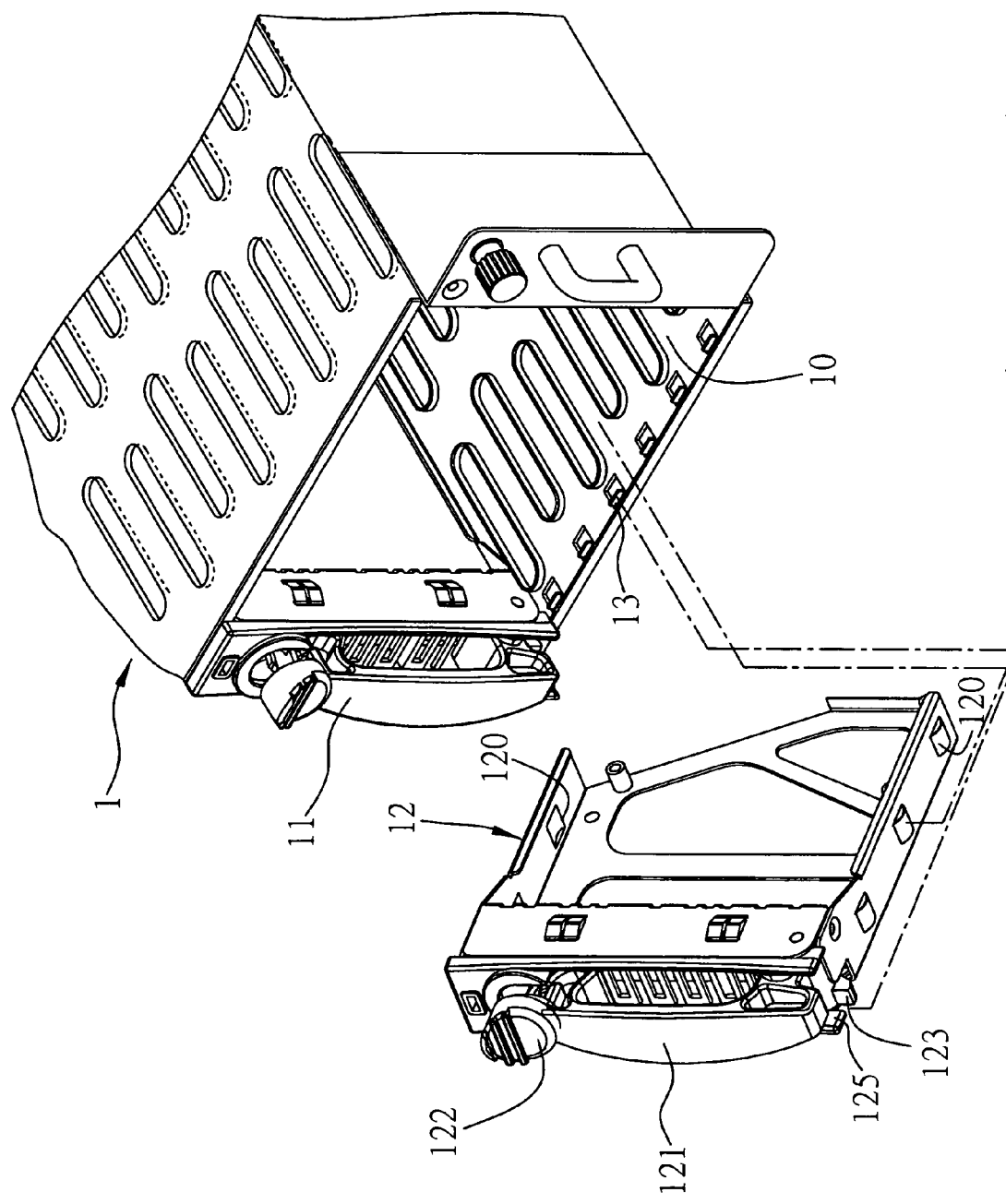
FIG. 1 (PRIOR ART) is a schematic view illustrating a connectional shield member inserted in the slot of a server.
Figure 2:
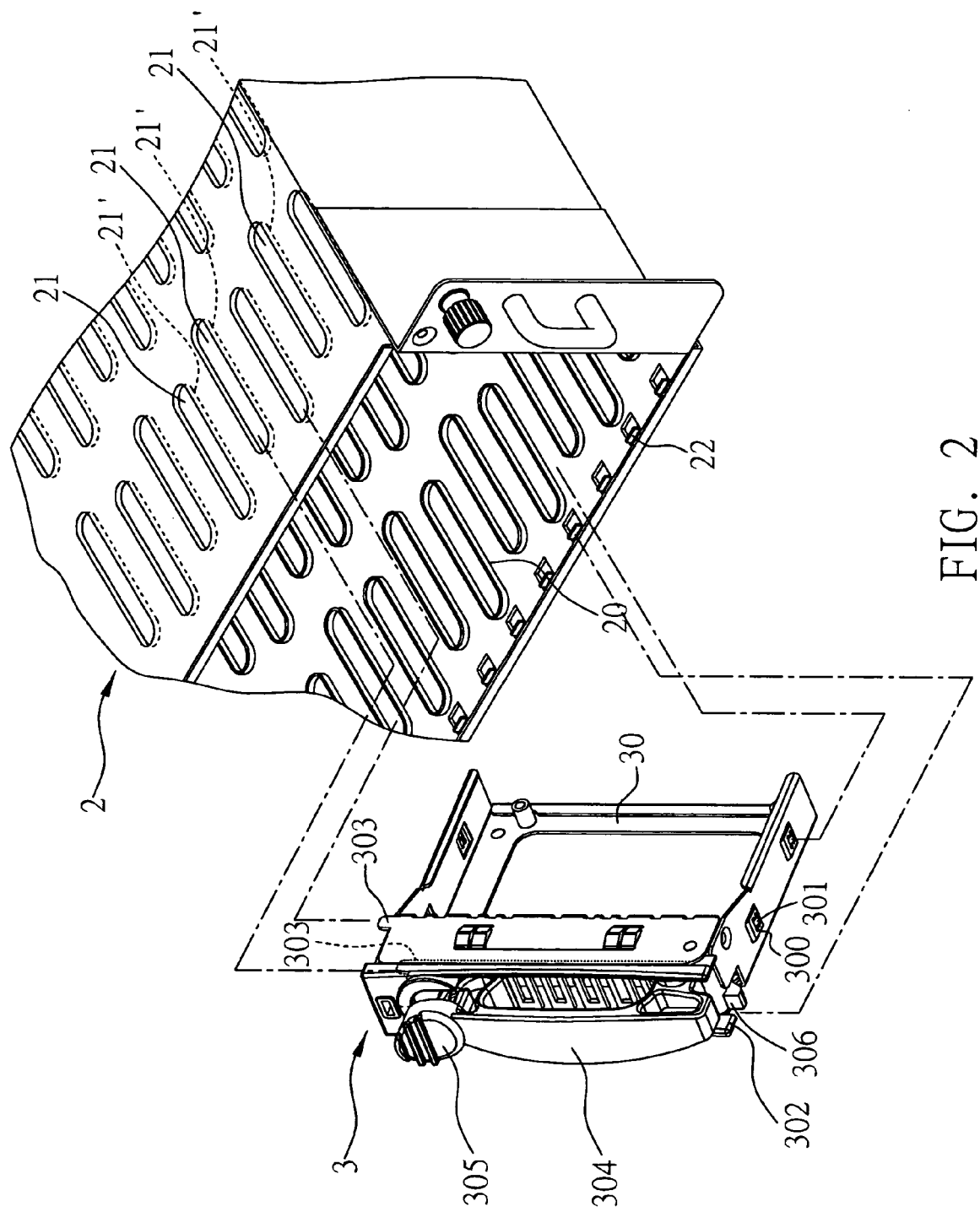
FIG. 2 is a schematic view illustrating a preferred embodiment of the shield member in accordance with the invention.

Referring to FIG. 2, a slot 20 of an electronic device 2 covered by a shield member 3 of the present invention is illustrated, wherein the electronic device 2 may be a server and the slot 20 is an inserting groove for carriers carrying hard disk (not shown) to be inserted therein; the electronic device 2 may also be a blade server and the slot 20 is an inserting groove for the blade bracket to be inserted therein.

The shield member 3 of the present invention comprises a body 30 for inserting and pluggable into the slot 10; a slide block 300 disposed on the surface of the body 30 and corresponding to the slot 20; and an elastic portion 301 disposed on the surface of the slide block 300 and elastically contacting the wall of the slot 10 for the body 30 to be tightly inserted into the slot 20.

In contrast to prior techniques that necessitates increasing the length of a shield member so as to dispose more slide blocks thereon, the shield member 3 of the invention employs an elastic portion 301 that elastically connects the wall of the slot so that the body can be smoothly and tightly inserted in the slot, thereby reducing the length and the material cost as a result.

The slot 20 of the electronic device 2 is provided with a first connecting tab 22 while the shield member 3 includes a second connecting tab 302 protruding from one side of the body 30 that corresponds to the first connecting tab 200 to position and meet the insertion depth of the shield member 30 in the slot 20.

When the body 30 is inserted in the slot 20, the elastic portion 301 is pressed by the wall of the slot 20 to tightly insert in the slot, which reduces the possibility of getting stuck in the slot 20 as the elastic portion enables the second connecting tab thereof to connect and abut against the first connecting tab, thereby overcoming the drawback of disengagement from one another as occurred in the prior art.

In addition, a plurality of openings 21 is juxtaposed provided on the two sides of the electronic device 2, and a plurality of protrusive rings 21' are formed in the electronic device 2 to correspond to the edge of each of the plurality of the openings 21, thereby forming an inserting groove/slot by the spacing of protrusive rings for the body 30 to be inserted therein; more specifically, the opening 21 can be made by a flushing process flushing from an inward direction on the surface of the electronic device 2, and the edge material remaining from the flushing process of forming the opening 21 can be folded toward an inward direction to form protrusive rings 21'; the shield member 3 of the invention can include a plurality of third connecting tabs 303 that respectively connect with protrusive rings 21' disposed on both sides of the slot 20, wherein the third connecting tab 303 and the second connecting tab 302 are respectively disposed on both sides of the body 30, and the third connecting tab 303 further corresponds to the engagement of the first and second connecting tabs to connect at an end of the protrusive ring 21, thereby enforcing the insertion of the body 30 in the slot 20 and spreading the pressure exerted to the second connecting tab 302.

Further, a handle 304 is axially connected to the front of the body 30 of the shield member 3 that flexibly connects with the body 30 to collectively form a block body 305 with the handle 304, wherein one end of the handle 304 is installed with the block body 305 whereas the other end thereof is disposed with a wedge 306 which connects an inner wall of the first connecting tab 200 by the assembly of the handle 304 on the block body 305, and works in conjunction with the second connecting tab 302 that connects an outer wall of the first connecting tab 200 to fasten the shield member 3 in the slot 20; on the other hand, it require only moving the block body 305 to release the engagement with the handle 304 to remove the shield member 3 from the slot 20.

Figure 3:
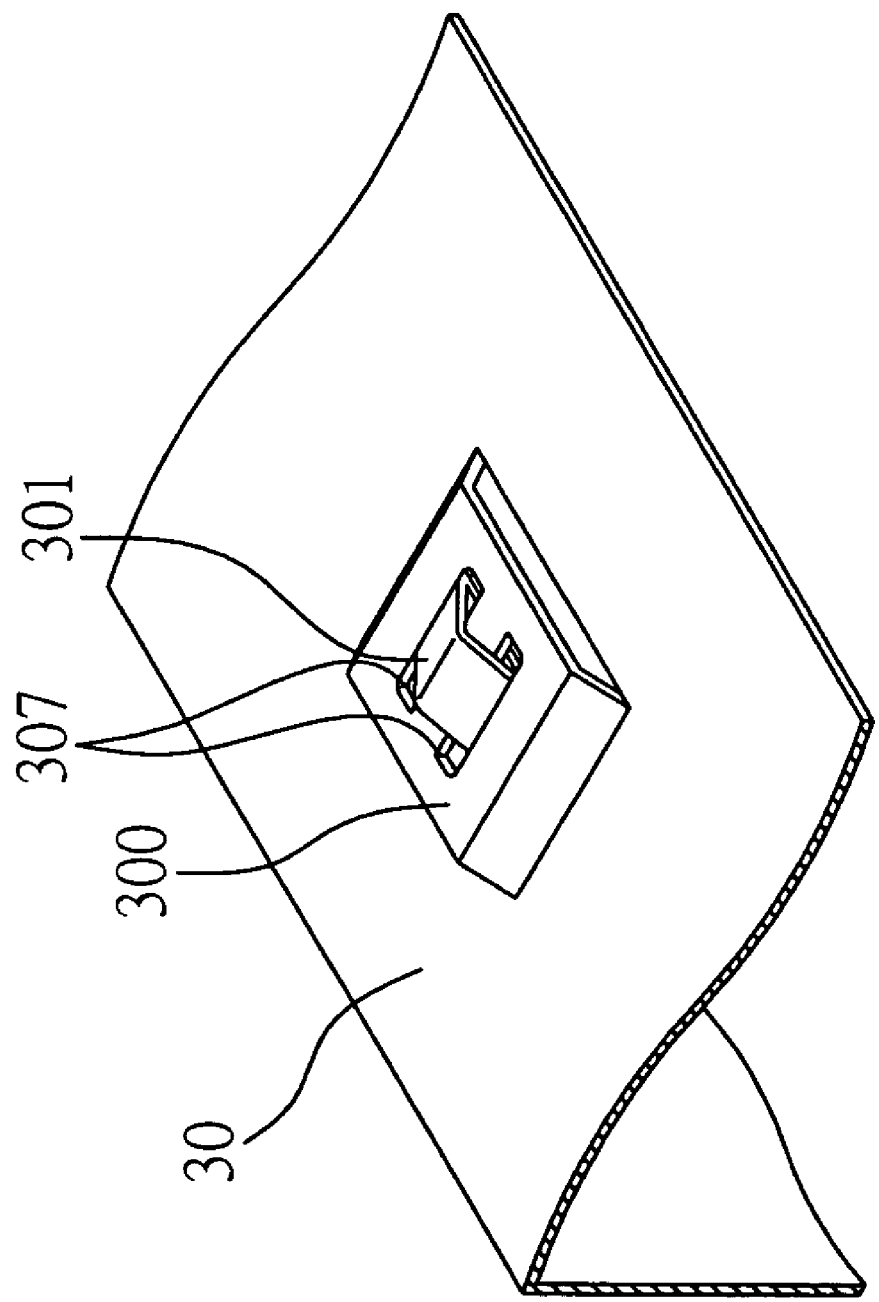
FIG. 3 is a schematic view illustrating an elastic portion of the shield member connecting with a slide block in accordance with the invention.

Referring to FIG. 3, the elastic portion 301 may be an elastic tab which can be installed on the slide block 300 having a plurality of assembly holes 307 formed thereon, preferably, the elastic tab is frame-shaped and the hollow portion thereof is formed with assembly holes 307, the shape of the frame may be a triangle or any other shapes.

The aforementioned are only exemplary preferred embodiments of the present invention. The scope of the claims as stated below should be accorded the broadest interpretation so as to encompass various modifications and similar arrangements made to the herein described invention that fall within the spirit of the basic principles and technology of the present invention.

What is claimed is:

1. A shield member for shielding a slot of an electronic device, the shield member comprising:
   a body for being inserted into the slot;
   a slide block disposed on the body and corresponding to the slot; and
   a triangular elastic tab disposed on the slide block and contacting a wall of the slot for the body to be tightly inserted into the slot,
   wherein the slide block includes juxtaposed assembly holes for installing the elastic tab, and the elastic tab is in the shape of a frame forming a hollow portion and the hollow portion thereof is used to install the assembly holes.

2. The shield member according to claim 1, wherein the electronic device is a server, and the slot is an inserting groove for a hard disk carrier to be inserted therein.

3. The shield member according to claim 1, wherein the electronic device is a blade server, and the slot is an inserting groove for a blade bracket to be inserted therein.

4. The shield member according to claim 1, wherein the slot is provided with a first connecting tab, and a second connecting tab is disposed on an edge surface of the body and corresponding to an outer edge of the first connecting tab, thereby positioning the insertion depth of the shield member in the slot.

5. The shield member according to claim 4, wherein the front of the body connects axially to a handle that flexibly connects with the body to collectively form a block body with the handle, one end of the handle being installed with the block body whereas the other end thereof is disposed with a wedge which connects to an inner wall of the first connecting tab by the assembly of the handle on the block body.

6. The shield member according to claim 1, wherein a plurality of openings are provided and arranged on the two sides of the electronic device, and a plurality of protrusive rings are formed in the electronic device to correspond to the edge of each of the plurality of the openings, thereby forming an inserting groove/slot by the spacing of protrusive rings for the body to be inserted therein.

7. The shield member according to claim 6, further comprising a plurality of third connecting tabs disposed and protruding from the body to be respectively stopped by the protrusive rings disposed on both sides of the slot.

8. The shield member according to claim 6, wherein the opening is made by a flush process flushing from an inward direction on the surface of the electronic device, and the edge material remaining from the flushing process of forming the opening can be folded toward an inward direction to form protrusive rings.

* * * * *